US012672374B2

(12) United States Patent
Lee et al.

(10) Patent No.: US 12,672,374 B2
(45) Date of Patent: Jun. 30, 2026

(54) IMAGE SENSOR AND MANUFACTURING METHOD THEREOF

(71) Applicant: Powerchip Semiconductor Manufacturing Corporation, Hsinchu (TW)

(72) Inventors: Shih-Ping Lee, Hsinchu City (TW); Peng-Tse Chen, Hsinchu (TW); Chih-Ping Chung, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 367 days.

(21) Appl. No.: 18/358,924

(22) Filed: Jul. 25, 2023

(65) Prior Publication Data

US 2025/0006757 A1     Jan. 2, 2025

(30) Foreign Application Priority Data

Jun. 28, 2023     (TW) .................................. 112124062

(51) Int. Cl.
*H10F 39/00*          (2025.01)
*H04N 25/532*       (2023.01)
(52) U.S. Cl.
CPC ....... *H10F 39/8057* (2025.01); *H04N 25/532* (2023.01); *H10F 39/024* (2025.01)
(58) Field of Classification Search
CPC . H04N 25/531; H04N 25/532; H10F 39/8057
See application file for complete search history.

(56) References Cited

U.S. PATENT DOCUMENTS

| | | | |
|---|---|---|---|
| 7,633,106 | B2 | 12/2009 | Adkisson et al. |
| 8,569,126 | B2 | 10/2013 | Takao |
| | | (Continued) | |

FOREIGN PATENT DOCUMENTS

| | | |
|---|---|---|
| CN | 115668500 | 1/2023 |
| TW | I672806 | 9/2019 |
| | (Continued) | |

OTHER PUBLICATIONS

"Office Action of Taiwan Counterpart Application", issued on May 15, 2024, p. 1-p. 5.

*Primary Examiner* — Mounir S Amer
*Assistant Examiner* — Alexander Belousov
(74) *Attorney, Agent, or Firm* — JCIPRNET

(57) ABSTRACT

An image sensor includes a substrate, a global shutter component, a ground doped region, and a light-shielding layer. The substrate at least has a pixel array region and a border region adjacent to each other. The global shutter component is located on the pixel array region, and the global shutter component includes a storage node. The ground doped region is located on the border region. The light-shielding layer is located on the pixel array region and the border region and is electrically connected to the ground doped region. The light-shielding layer includes a first light-shielding layer and a second light-shielding layer. The first light-shielding layer is located on the pixel array region and covers the storage node, and the second light-shielding layer is located on the border region and surrounds the global shutter component. A manufacturing method of an image sensor is also provided.

10 Claims, 17 Drawing Sheets

(56)  References Cited

U.S. PATENT DOCUMENTS

| | | | | |
|---|---|---|---|---|
| 8,803,062 | B2 | 8/2014 | Itahashi | |
| 10,623,673 | B2 * | 4/2020 | Kawai | H04N 23/76 |
| 10,896,922 | B2 * | 1/2021 | Kobayashi | H10F 39/8033 |
| 11,664,398 | B2 * | 5/2023 | Chen | H10F 39/802 |
| | | | | 257/292 |
| 2011/0241121 | A1 * | 10/2011 | Kwon | H10B 10/12 |
| | | | | 257/E27.098 |
| 2013/0264688 | A1 | 10/2013 | Qian et al. | |
| 2015/0060966 | A1 | 3/2015 | Lenchenkov et al. | |
| 2017/0207257 | A1 * | 7/2017 | Nishihara | H10F 39/8033 |
| 2018/0366499 | A1 * | 12/2018 | Kobayashi | H10F 39/8033 |
| 2019/0035832 | A1 * | 1/2019 | Kobinata | H04N 25/532 |
| 2019/0273881 | A1 * | 9/2019 | Kawai | H04N 23/76 |
| 2019/0371846 | A1 * | 12/2019 | Arakawa | H10F 39/18 |
| 2020/0075648 | A1 * | 3/2020 | Lee | H10F 39/8057 |
| 2021/0225916 | A1 * | 7/2021 | Hsieh | H10F 39/8057 |
| 2021/0351215 | A1 * | 11/2021 | Tseng | H04N 25/7795 |
| 2024/0363658 | A1 * | 10/2024 | Tseng | H10F 39/8063 |

FOREIGN PATENT DOCUMENTS

| | | |
|---|---|---|
| TW | I675465 | 10/2019 |
| TW | 202025472 | 7/2020 |

* cited by examiner

100

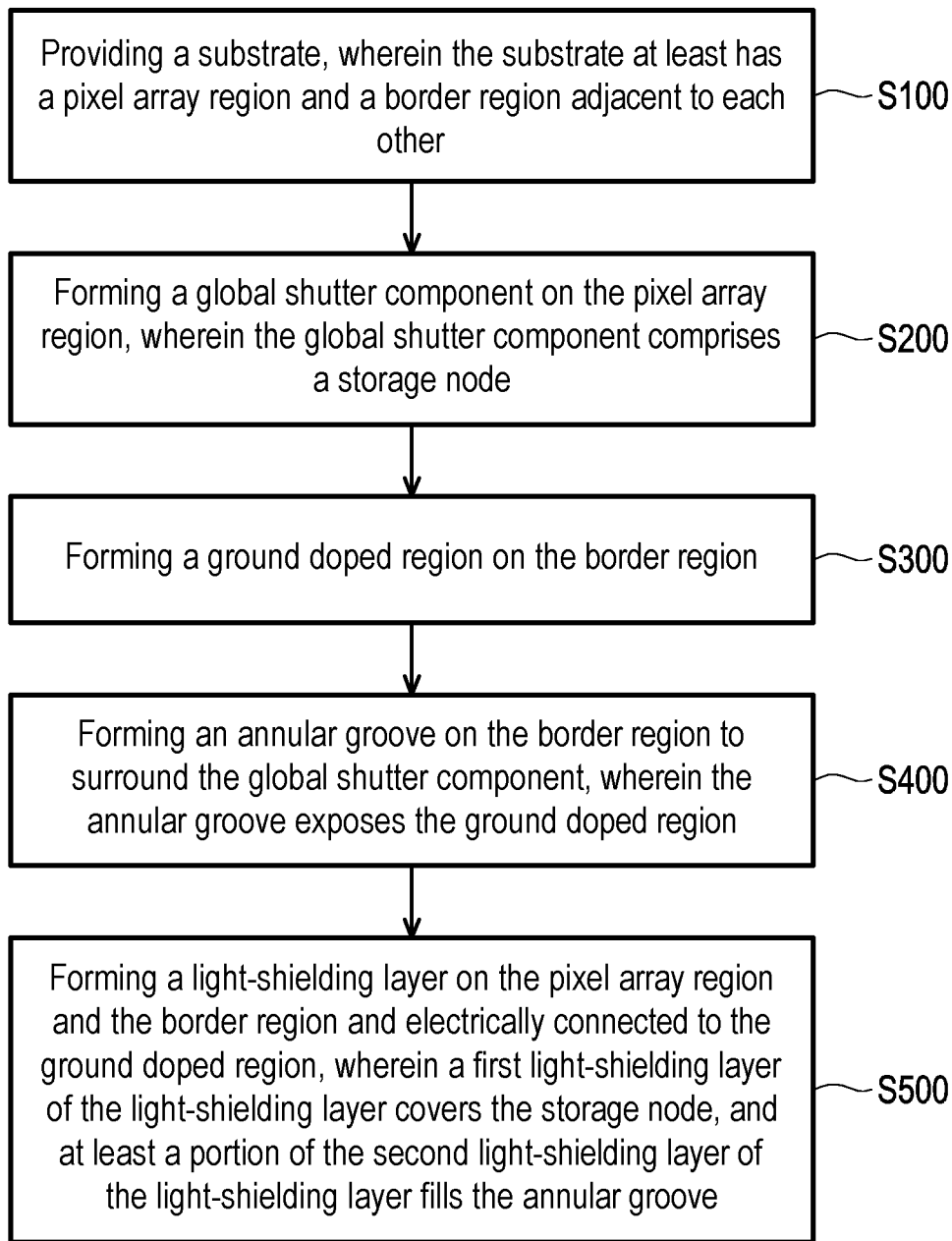

Providing a substrate, wherein the substrate at least has a pixel array region and a border region adjacent to each other ⎯ S100

Forming a global shutter component on the pixel array region, wherein the global shutter component comprises a storage node ⎯ S200

Forming a ground doped region on the border region ⎯ S300

Forming an annular groove on the border region to surround the global shutter component, wherein the annular groove exposes the ground doped region ⎯ S400

Forming a light-shielding layer on the pixel array region and the border region and electrically connected to the ground doped region, wherein a first light-shielding layer of the light-shielding layer covers the storage node, and at least a portion of the second light-shielding layer of the light-shielding layer fills the annular groove ⎯ S500

FIG. 5

IMAGE SENSOR AND MANUFACTURING METHOD THEREOF

CROSS-REFERENCE TO RELATED APPLICATION

This application claims the priority benefit of Taiwan application serial no. 112124062, filed on Jun. 28, 2023. The entirety of the above-mentioned patent application is hereby incorporated by reference herein and made a part of this specification.

BACKGROUND

Technical Field

The disclosure relates to a sensor and a manufacturing method thereof, and in particular, relates to an image sensor and a manufacturing method thereof.

Description of Related Art

Regarding the commonly-used rolling shutter image sensors, this type of image sensors read signals sequentially, but the time difference between reading the signals may easily lead to image deformation, such as blurring, distorting, and shaking, and image distortion may further occur as a result. Therefore, the rolling shutter image sensors are gradually replaced by the global shutter image sensing technology.

Further, the global shutter image sensors have storage nodes, which can be used as regions where signals can be temporarily stored, so that the aforementioned image distortion caused by the time difference is decreased. However, since the storage nodes are more easily affected by light, the problem of high parasitic light sensitivity may occur. Therefore, how to improve this problem is an important issue.

SUMMARY

The disclosure provides an image sensor and a manufacturing method thereof capable of effectively lower parasitic light sensitivity.

The disclosure provides an image sensor including a substrate, a global shutter component, a ground doped region, and a light-shielding layer. The substrate at least has a pixel array region and a border region adjacent to each other. The global shutter component is located on the pixel array region, and the global shutter component includes a storage node. The ground doped region is located on the border region. The light-shielding layer is located on the pixel array region and the border region and is electrically connected to the ground doped region. The light-shielding layer includes a first light-shielding layer and a second light-shielding layer. The first light-shielding layer is located on the pixel array region and covers the storage node, and the second light-shielding layer is located on the border region and surrounds the global shutter component.

The disclosure further provides a manufacturing method of an image sensor, and the method includes the following steps. A substrate is provided. The substrate at least has a pixel array region and a border region adjacent to each other. A global shutter component is formed on the pixel array region. The global shutter component includes a storage node. A ground doped region is formed on the border region. An annular groove is formed on the border region to surround the global shutter component. The annular groove exposes the ground doped region. A light-shielding layer is formed on the pixel array region and the border region and is electrically connected to the ground doped region. The light-shielding layer includes a first light-shielding layer and a second light-shielding layer. The first light-shielding layer covers the storage node, and at least a portion of the second light-shielding layer fills the annular groove.

To sum up, in the image sensor provide by the disclosure, the light-shielding layer on the pixel array region blocks the light from the above, and the light-shielding layer on the border region blocks the stray light from the side. In this way, the light incident on the region of the storage node may be significantly reduced, so that the parasitic light sensitivity caused by the storage node is effectively lowered.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 5 is a schematic flow chart of part of a manufacturing process of an image sensor according to an embodiment of the disclosure.

DESCRIPTION OF THE EMBODIMENTS

Figure 1:
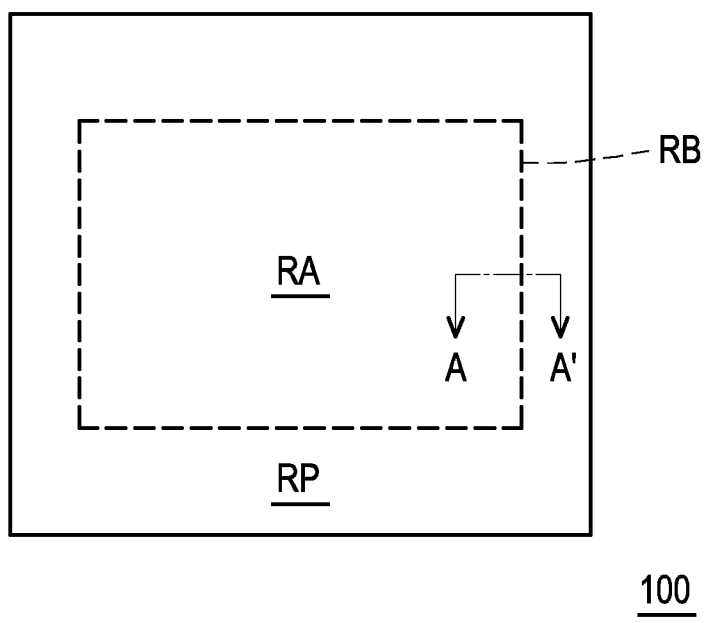
FIG. 1 is a schematic top view of a portion of an image sensor according to an embodiment of the disclosure.

The disclosure is more comprehensively described with reference to the figures of the present embodiments. However, the disclosure can also be implemented in various different forms, and is not limited to the embodiments in the present specification. Thicknesses, dimensions, and sizes of layers or regions in the drawings are exaggerated for clarity. The same reference numbers are used in the drawings and the description to indicate the same or like parts, which are not repeated in the following embodiments.

Directional terminology (e.g., top, down, right, left, front, rear, top, and bottom) is used with reference to the orientation of the figure(s) being described. As such, the directional terminology is used for purposes of illustration and is in no way limiting.

Unless otherwise defined, all terms (including technical and scientific terms) used herein have the same meaning as commonly understood by a person having ordinary skill in the art.

Figure 2:
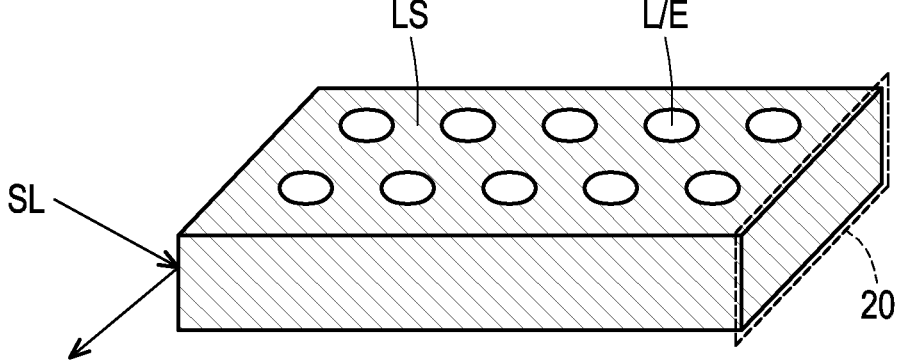
FIG. 2 is a schematic three-dimensional view illustrating an intermediate structure formed to a light-shielding layer in a portion of the image sensor according to an embodiment of the disclosure.

FIG. 1 is a schematic top view of a portion of an image sensor according to an embodiment of the disclosure. FIG. 2 is a schematic three-dimensional view illustrating an intermediate structure formed to a light-shielding layer in a portion of the image sensor according to an embodiment of the disclosure. FIG. 3A to FIG. 3G are partial cross-sectional schematic views of manufacturing steps of an implementation of the disclosure taken along a sectional line A-A' of FIG. 1. FIG. 4A to FIG. 4H are partial cross-sectional schematic views of manufacturing steps of another implementation of the disclosure taken along the sectional line A-A' of FIG. 1.

Figure 3A:
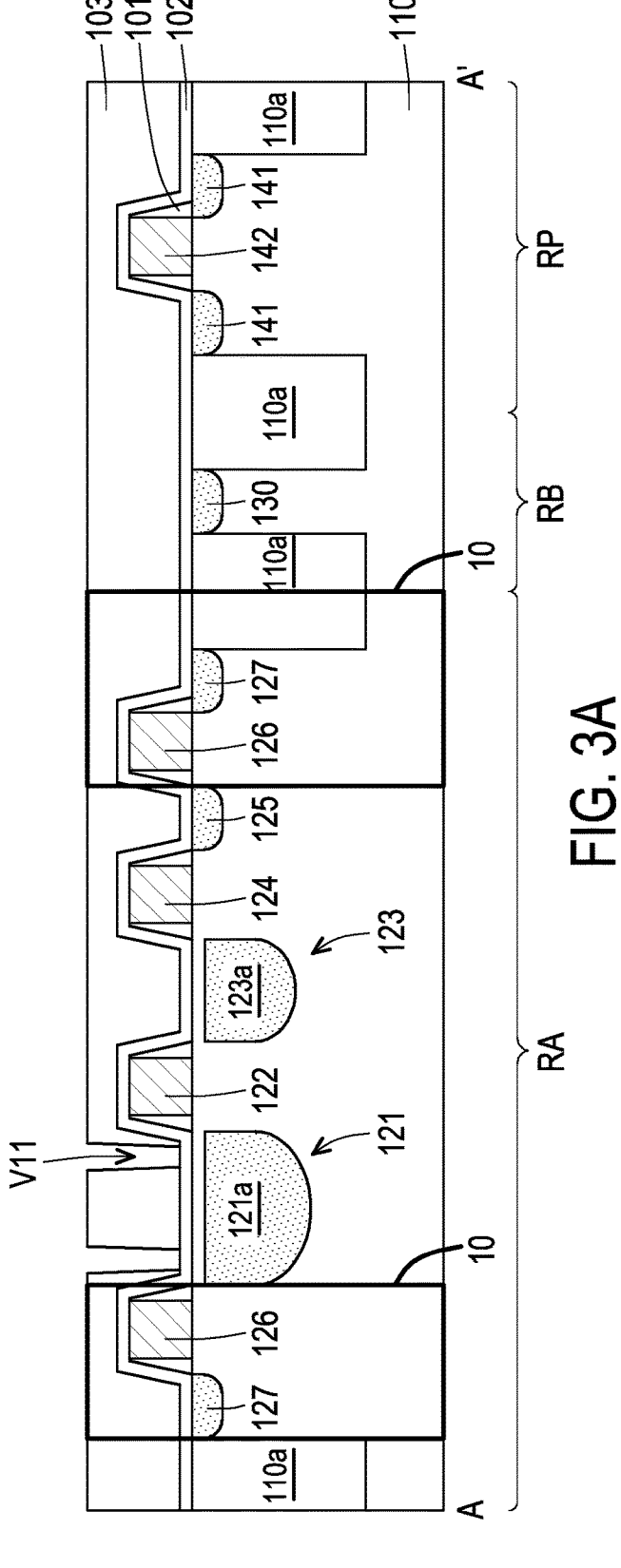
FIG. 3A to FIG. 3G are partial cross-sectional schematic views of manufacturing steps of an implementation of the disclosure taken along a sectional line A-A' of FIG. 1.
Figure 3B:
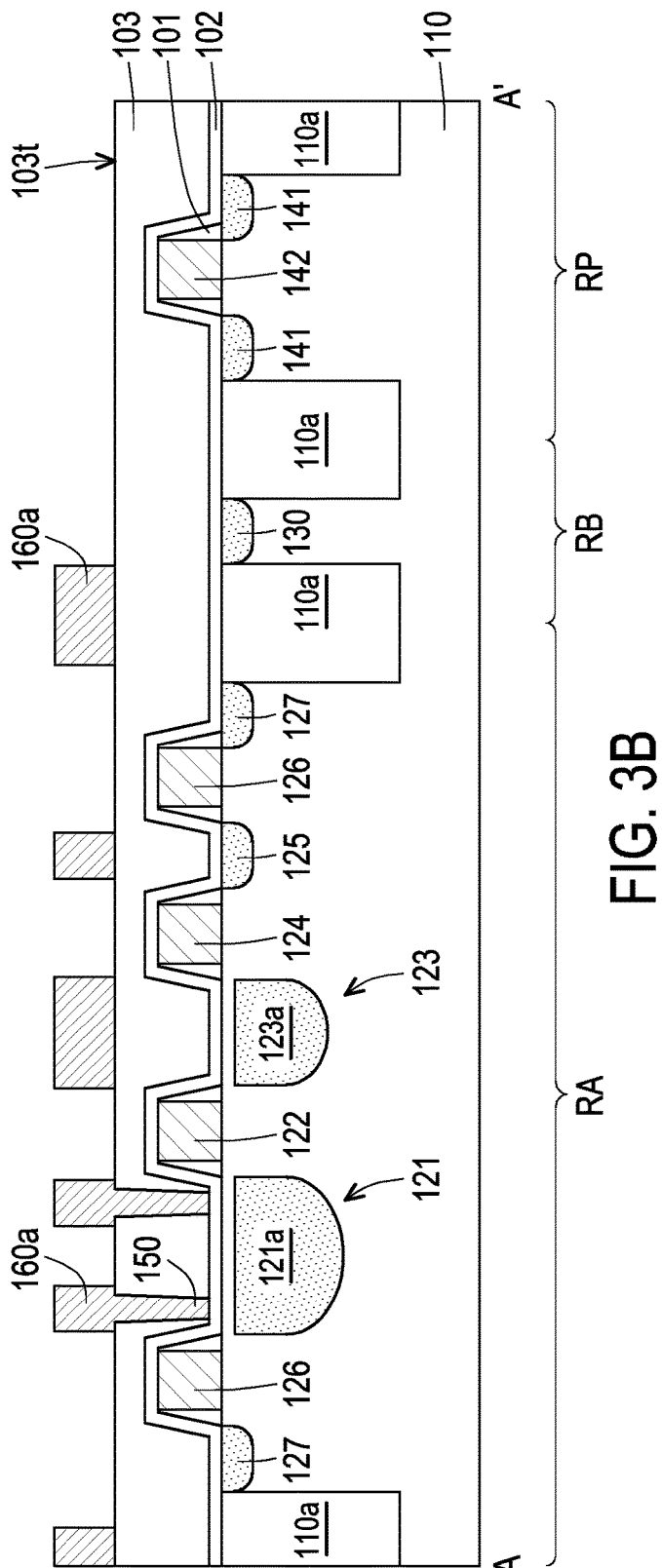
Figure 3B:
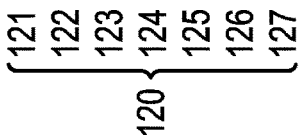
Figure 3C:
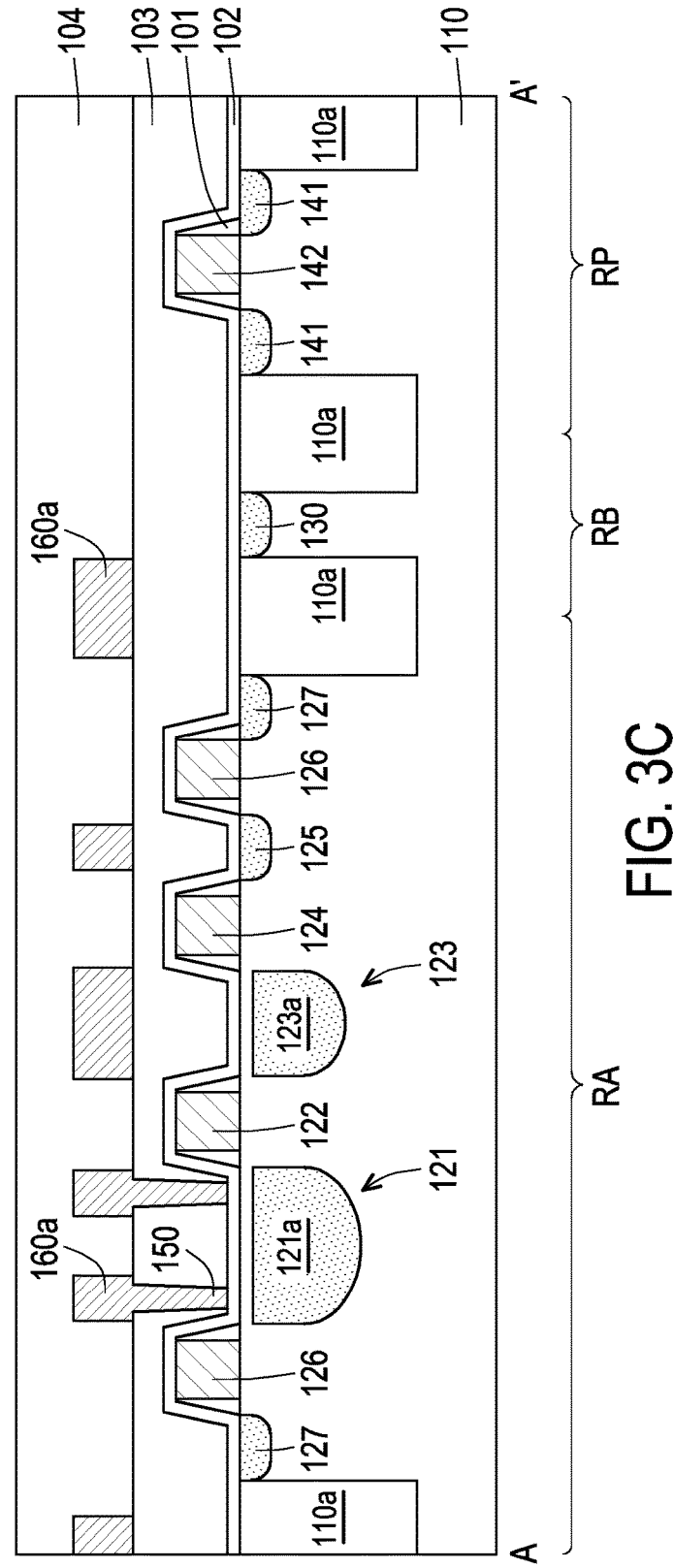
Figure 3C:
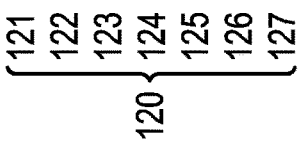
Figure 3D:
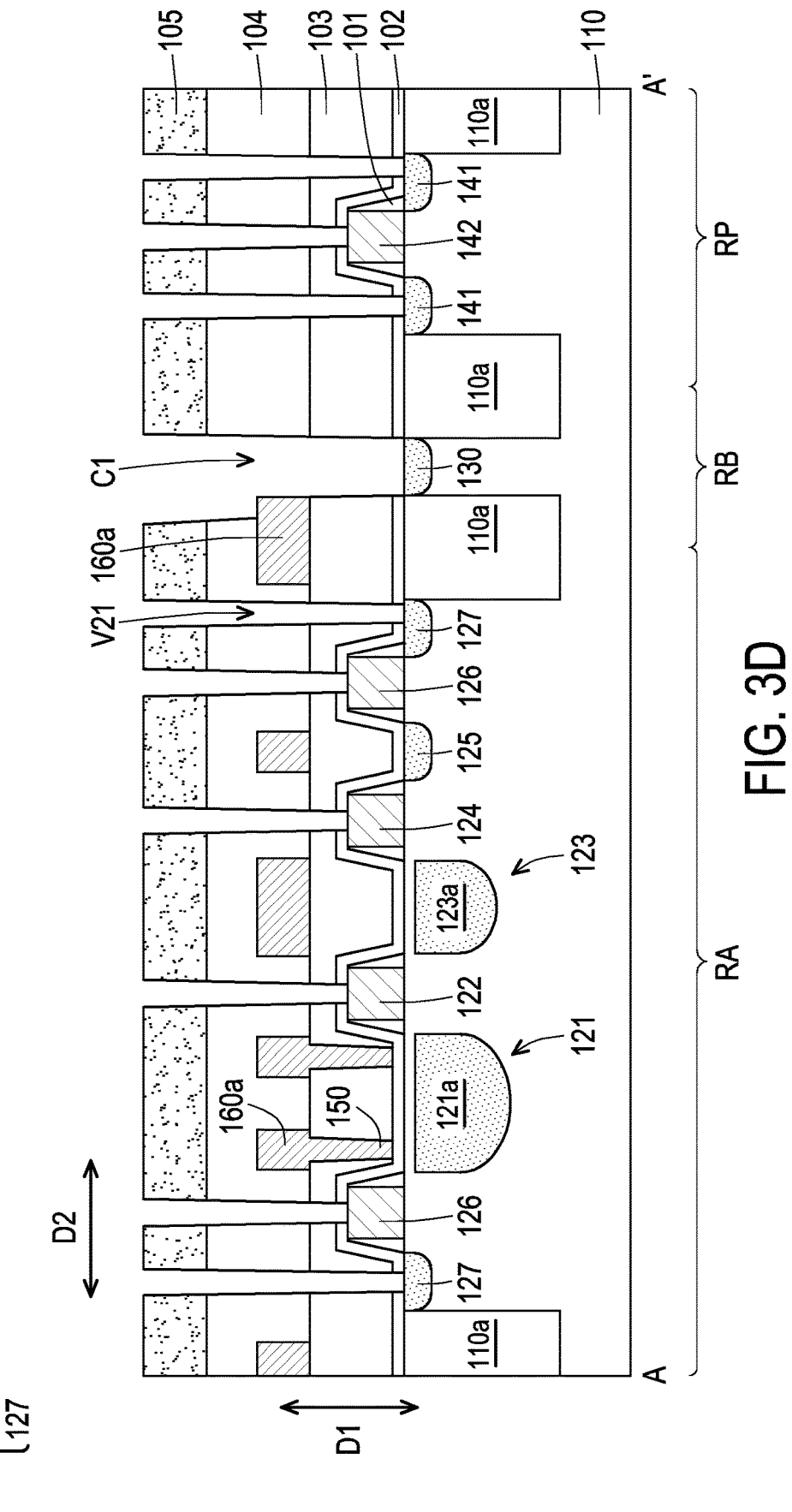
Figure 3E:
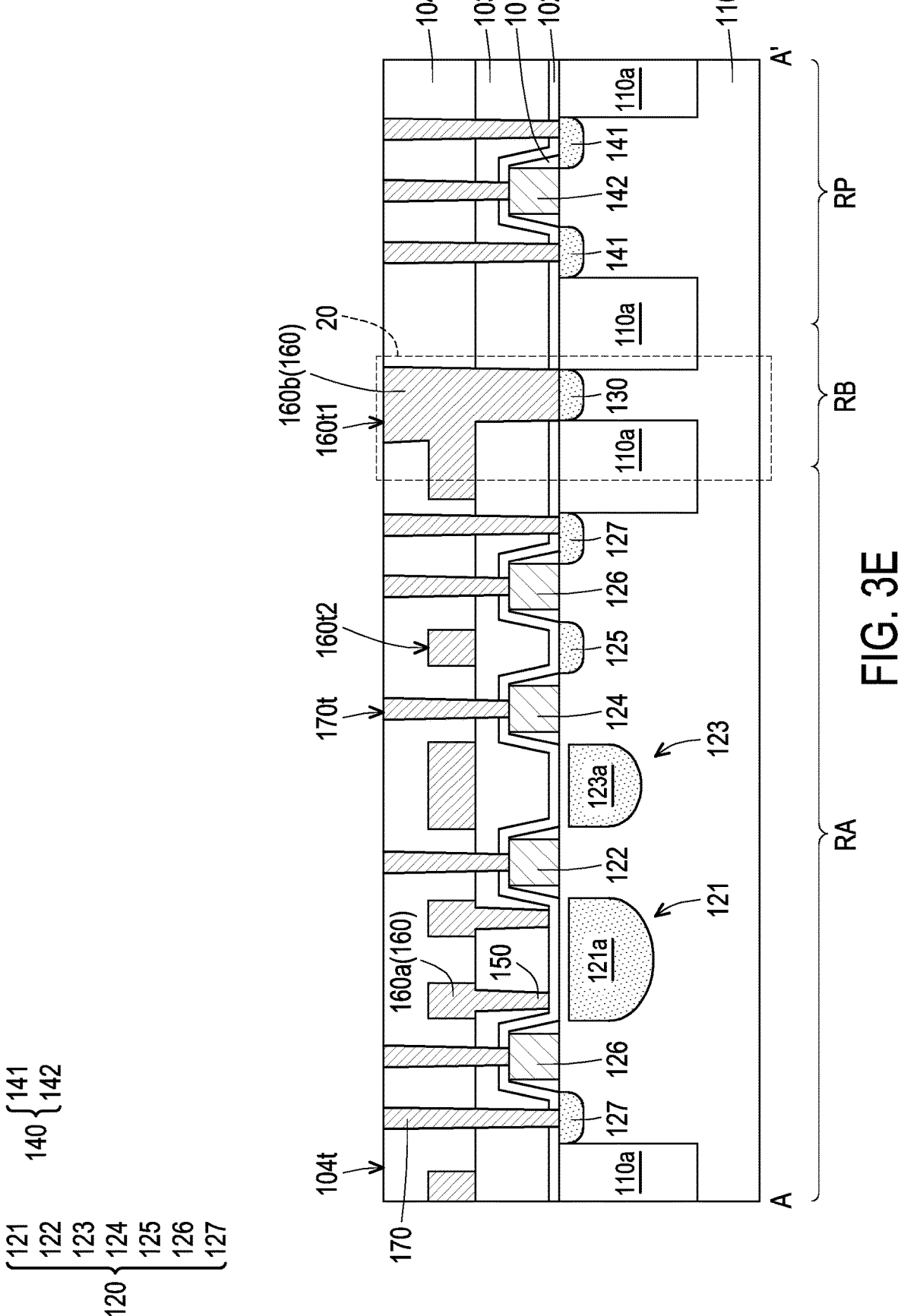
Figure 4A:
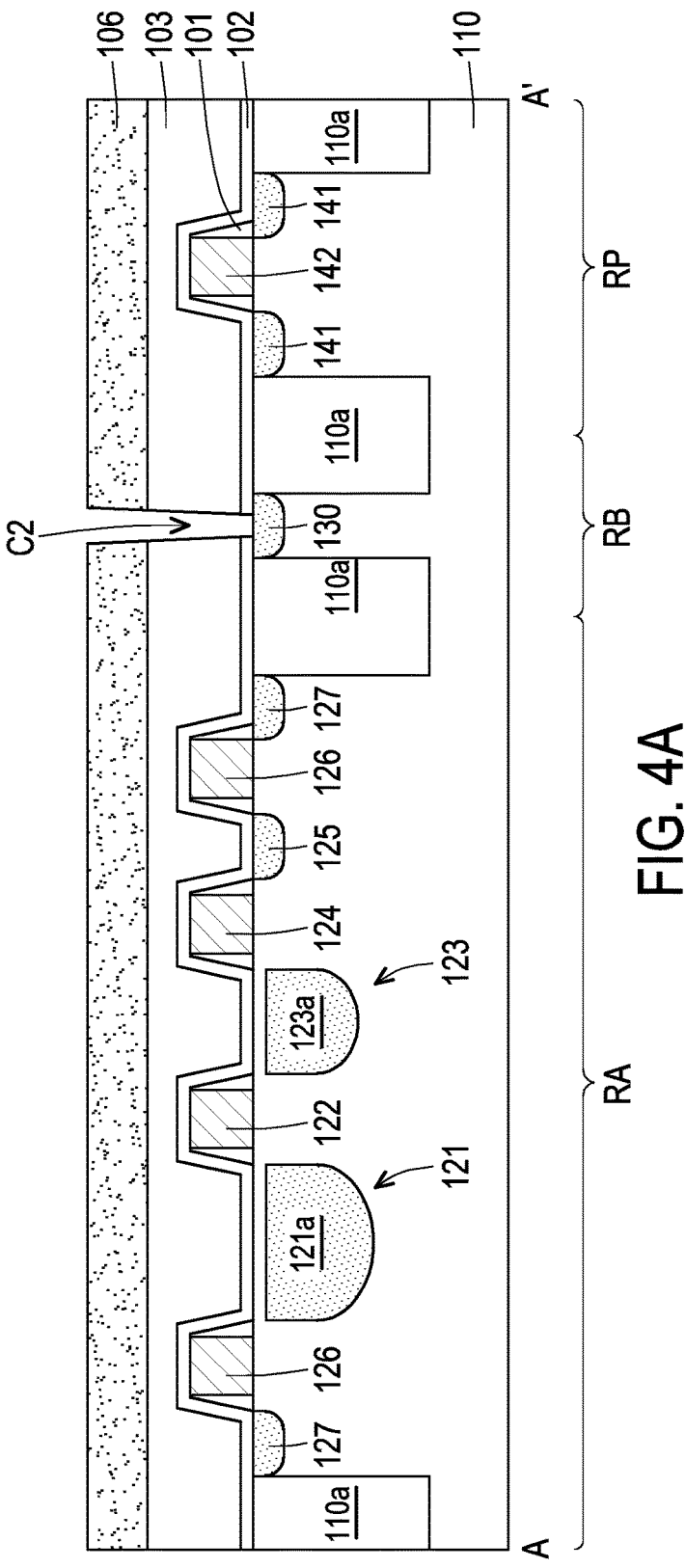
FIG. 4A to FIG. 4H are partial cross-sectional schematic views of manufacturing steps of another implementation of the disclosure taken along the sectional line A-A' of FIG. 1.
Figure 4A:
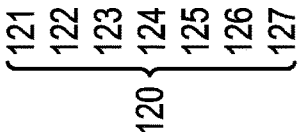
Figure 4B:
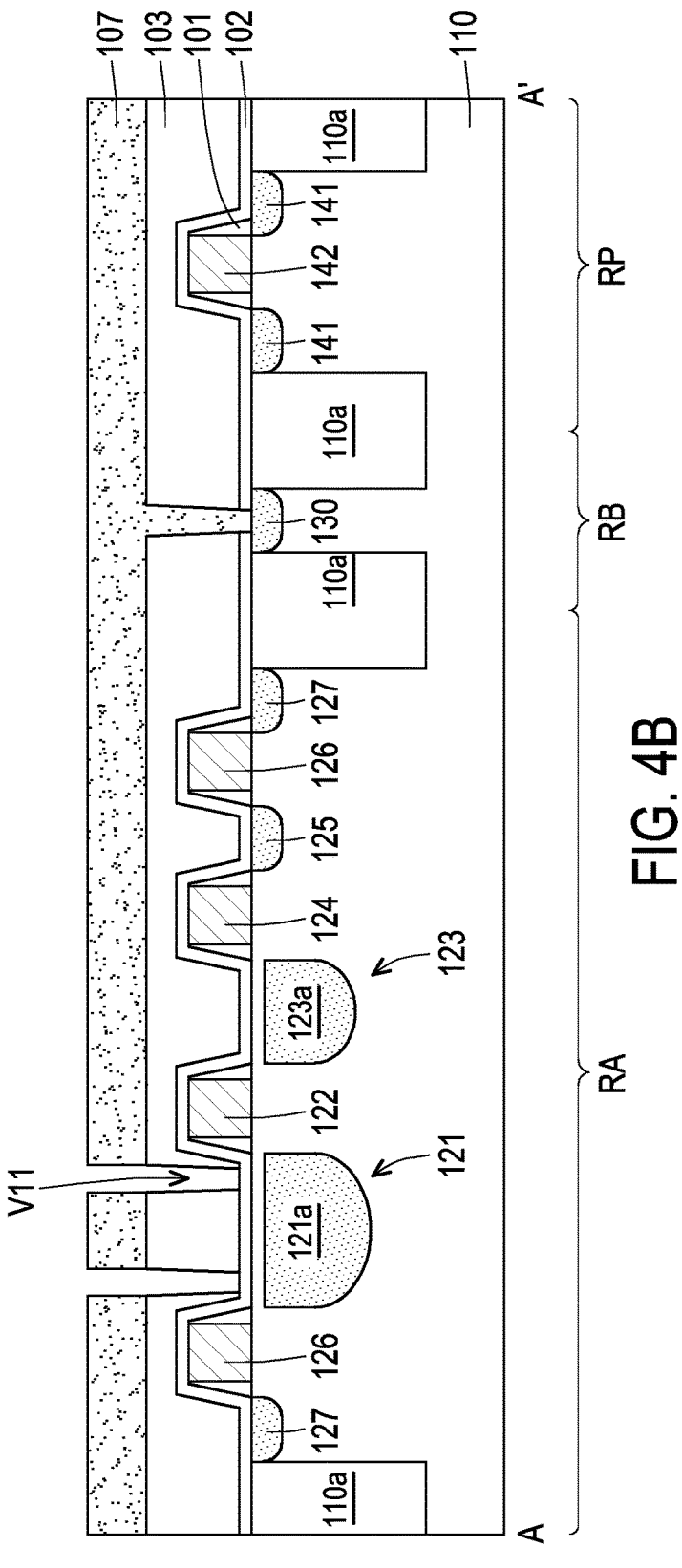
Figure 4B:
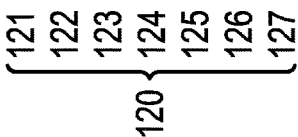
Figure 4C:
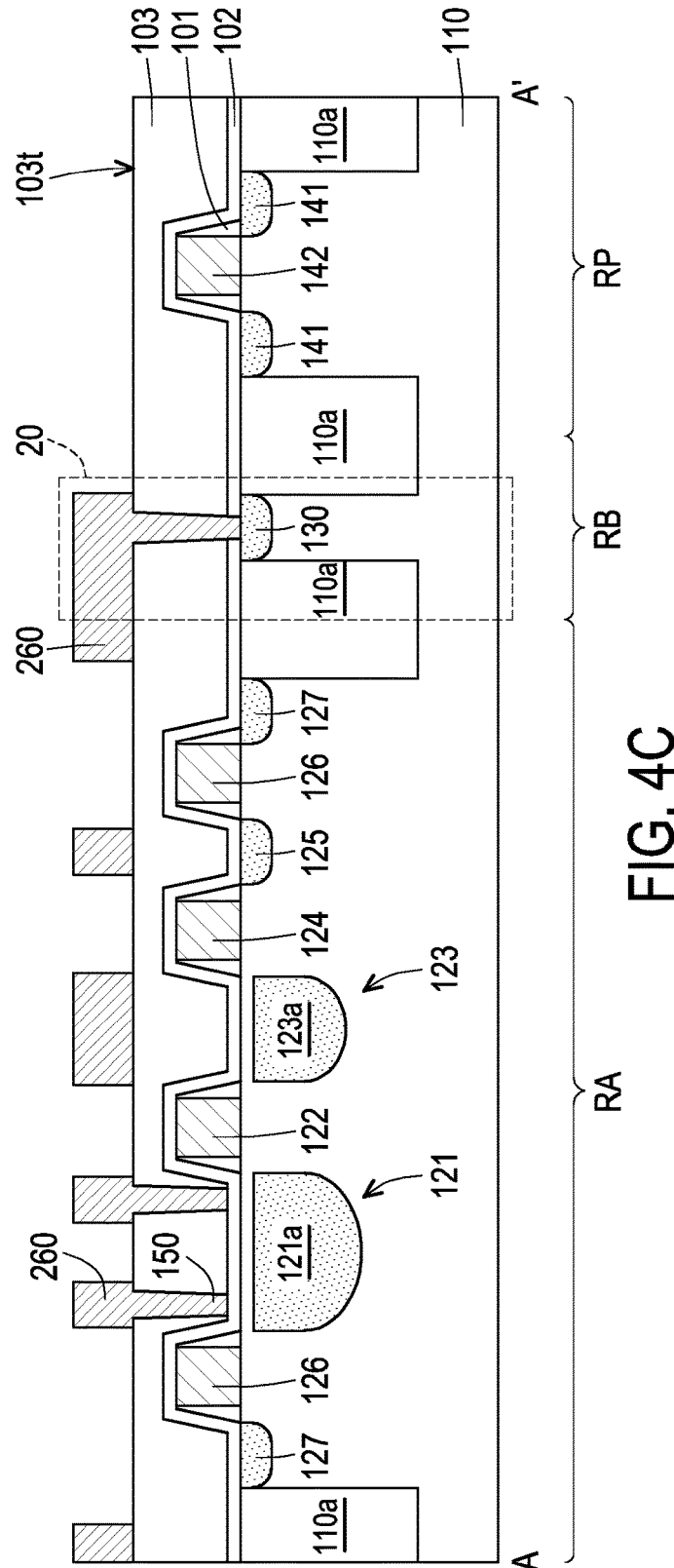
Figure 4C:
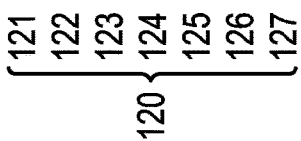

It should be noted that the intermediate structure of the image sensor in FIG. 2 may have at least two implementations in the vertical section, such as the intermediate structure of an image sensor 100 in FIG. 3E or the intermediate structure of an image sensor 200 in FIG. 4C. Further, the manufacturing steps of the image sensor 100 will be described first, and the manufacturing steps of the image sensor 200 will be described next. The structures and the manufacturing methods of the image sensor 100 and the image sensor 200 described herein belong to the protection scope of the disclosure.

With reference to FIG. 1 and FIG. 3A, a substrate 110 is provided, and the substrate 110 has, for example, a pixel array region RA, a border region RB, and a peripheral region RP. Further, the pixel array region RA is adjacent to the border region RB, and the border region RB is between the pixel array region RA and the peripheral region RP. The pixel array region RA, the border region RB, and the peripheral region RP may be arranged sequentially from the center of the substrate 110 outwards, but the disclosure is not limited thereto.

Next, a global shutter component 120 is formed on the pixel array region RA, a ground doped region 130 is formed on the border region RB, and a peripheral circuit element 140 is formed on the peripheral region RP. Herein, the formation sequence of the components on the abovementioned regions is not limited in the disclosure, and the formation sequence of the components on the abovementioned regions may be determined according to actual design needs.

In this embodiment, the global shutter component 120 includes a photoelectric element (photodiode) 121, a gate 122, a storage node 123, a gate 124, and a floating diffusion region 125. Herein, since the aforementioned components are arranged in sequence towards the border region RB, the gate 122 is located between the photoelectric element 121 and the storage node 123, and the gate 124 is located between the storage node 123 and the floating diffusion region 125. In this way, operations, such as collecting photons through the photoelectric element 121, opening a channel through the gate 122 (which is a transfer gate) to transmit the photons to the storage node 123, and opening the channel through the gate 124 (as a transfer gate) to transmit a signal to the floating diffusion region 125 when necessary, may be implemented. Herein, the photoelectric element 121, the storage node 123, and the floating diffusion region 125 may be located on the substrate 110, and the gates 122 and 124 may be located on a surface of the substrate 110.

In this embodiment, the global shutter component 120 further includes a gate 126 and a doped region 127 as arranged in a solid line frame 10 of FIG. 3A to provide functions such as a transistor. Therefore, after the signal absorbed by the floating diffusion region 125 changes the corresponding potential energy, connection to a metal-oxide-semiconductor field-effect transistor (MOSFET) formed by the gate 126 and the doped region 127 may be achieved, and the corresponding signal may be read, so that the global shutter component 120 may effectively operate.

It should be noted that the components in the solid line frame 10 may be optionally arranged, and other suitable components and arrangement may be also be provided according to actual design needs. Moreover, the arrangement of the circuit layers (e.g., the circuit layers M1 and M2 in FIG. 3G) thereon may also be adjusted according to actual design needs. In addition, only the outermost global shutter component 120 on the pixel array region RA is schematically shown in the figures of the disclosure. That is, the pixel array region RA in FIG. 1 may be formed by arranging a plurality of groups of global shutter components 120, and each global shutter component 120 group may be treated as one pixel.

Besides, the peripheral circuit element 140 on the peripheral region RP may include a doped region 141 (for example, as a source/drain) and a gate 142 in the substrate 110. Further, a plurality of isolation structures 110a may be formed in the substrate 110 to define a plurality of active regions on the substrate 110, such as defining the active region of the global shutter component 120, the active region of the ground doped region 130, and the active region of the peripheral circuit element 140. Each of the isolation structures 110 a is, for example, a shallow trench isolation (STI) structure, and the peripheral circuit element 140 may be a logic circuit or other suitable peripheral circuit elements, which are not limited in the disclosure.

In some embodiments, the substrate 110 is a semiconductor substrate (e.g., a silicon substrate) and may have a doping type different from the photoelectric element 121, the storage node 123, the floating diffusion region 125, the doped regions 127 and 141, and the ground doped region 130 to form corresponding members. If the substrate 110 is a P-type doped substrate 110, the photoelectric element 121 may be a photodiode formed by an N-type doped region 121a and a P-type doped substrate 110. The storage node 123 may be a PN diode formed by a N-type doped region 123a and the P-type doped substrate 110, and the floating diffusion region 125 is an N-type doped region. On the other hand, the doped region 127, the ground doped region 130, and the doped region 141 may also be N-type doped regions, but the disclosure is not limited thereto. Herein, the abovementioned doped regions are, for example, formed by ion implantation of suitable dopants, and may be selectively heavily doped regions (P+ or N+).

In some embodiments, the gates 122, 124, 126, and 142 may be formed by doping polysilicon or the like using a chemical vapor deposition process, a physical vapor deposition process or the like, a lithography process, and an etching process, but the disclosure is not limited thereto. The gates 122, 124, 126, and 142 may also be formed using other suitable materials and processes.

With reference to FIG. 3A again, after the gates 122, 124, 126, and 142 are formed, spacers 101 may be formed on side walls of the gates 122, 124, 126, and 142. In this embodiment, each of the spacers 101 may be a single-layer structure, but the disclosure is not limited thereto. In an embodiment that is not shown, the spacer may also be a multi-layer structure. Herein, the material of the spacers 101 is, for example, silicon oxide, silicon nitride, or a combination thereof. A spacer material layer (not shown) may be conformally formed on the gates first, and then etching and other processes are performed on the spacer material layer to form the spacers 101, but the disclosure is not limited thereto.

Further, after the spacers 101 are formed, a contact etch stop layer (CESL) 102 may be formed on the substrate 110 entirely. For example, the contact etch stop layer 102 may be formed on the pixel array region RA, the border region RB, and the peripheral region RP and cover top surfaces and the spacers 101 of the gates 122, 124, 126, and 142. In this embodiment, the contact etch stop layer 102 may be a single-layer structure formed of silicon nitride, but the disclosure is not limited thereto. The contact etch stop layer 102 may also be a multi-layer structure in which silicon oxide and silicon nitride are sequentially deposited on the substrate 110.

Next, a dielectric layer 103 is formed on the substrate 110 entirely. For instance, the dielectric layer 103 may be directly formed on the contact etch stop layer 102 of the pixel array region RA, the border region RB, and the peripheral region RP. Herein, the material of the dielectric layer 103 may include silicon oxide or similar dielectric materials and may be formed by deposition or similar processes. Herein, the dielectric layer 103 may be referred to as a first dielectric layer.

Next, a patterned photoresist is treated as a mask (not shown), and part of the dielectric layer 103 on the photo-electric element 121 is removed (for example, through an etching process) to form a plurality of contact vias V11. Herein, the contact vias V11 may expose the contact etch stop layer 102. That is, bottom surfaces of the contact vias V11 may be coplanar with a top surface of the contact etch stop layer 102, but the disclosure is not limited thereto. In an embodiment that is not shown, the contact vias may be formed in the dielectric layer without exposing the top surface of the contact etch stop layer 102, that is, the bottom surface of the contact vias may be higher than the top surface of the contact etch stop layer 102. Herein, the contact etch stop layer 102 may prevent the surface of the substrate 110 from being damaged during the process of forming the contact vias V11 by an etching process. Further, abovemen-tioned patterned photoresist may be referred to as a first patterned photoresist, and the contact vias V11 may be referred to as first contact vias.

With reference to FIG. 3A and FIG. 3B, a light-shielding material 160a is deposited in the contact vias V11 and extends onto a top surface 103t of the dielectric layer 103 to form a plurality of contacts 150 in the contact vias V11, and a portion of a light-shielding layer 160 is formed on the top surface 103t of the dielectric layer 103 (as shown in FIG. 3B). The light-shielding material 160a on the pixel array region RA may cover the storage node 123 to block light incident on the storage node 123 from above. Herein, the light-shielding material 160a may be made of tungsten (W) or other suitable light-shielding materials through a deposi-tion process or other suitable processes. Further, the light-shielding material 160a may be referred to as a first light-shielding material, and the contacts 150 may be referred to as first contacts.

In some embodiments, first, the light-shielding material 160a may be filled to the contact vias V11 and formed on the substrate 110 entirely, and next, a lithography patterning process is adopted to form a plurality of openings. The openings may correspond to a light incident/electrical con-nection portion L/E on the pixel array region RA in FIG. 2. For instance, the light incident portion of the light incident/electrical connection portion L/E may correspond to the photoelectric element 121, and the electrical connection portion of the light incident/electrical connection portion L/E may correspond to the gates 122, 124, 126, and 142. It should be noted that the light incident/electrical connection portion L/E in FIG. 2 is only schematically drawn and is not drawn according to the size of the openings in FIG. 3B.

In this embodiment, a portion of the light-shielding mate-rial 160a may extend from the top surface 103t of the dielectric layer 103 on the pixel array region RA to the top surface 103t of the dielectric layer 103 on the border region RB, and the contacts 150 may be physically connected to the light-shielding material 160a. On the other hand, at this stage, since the ground doped region 130 is not exposed, the light-shielding material 160a does not directly contact the ground doped region 130.

With reference to FIG. 3C, a dielectric layer 104 is formed on the substrate 110 entirely. For instance, the dielectric layer 104 may be formed on the pixel array region RA, the border region RB, and the peripheral region RP of the substrate 100 and cover the light-shielding material 160a. Herein, the material of the dielectric layer 104 may include silicon oxide or similar dielectric materials and may be formed by deposition or similar processes. Further, the materials of the dielectric layer 103 and the dielectric layer 104 may be the same or different, and the dielectric layer 104 may be referred to as a second dielectric layer.

In some embodiments, after the dielectric layer 104 is formed, a planarization process, such as a chemical mechanical polishing (CMP) process, may be further per-formed to improve the surface flatness of the dielectric layer 104, but the disclosure is not limited thereto.

With reference to FIG. 3D, a patterned photoresist 105 is treated as a mask, and part of the dielectric layer 103 and part of the dielectric layer 104 on the ground doped region 130 are removed (for example, through an etching process) to form an annular groove C1. The annular groove C1 surrounds the global shutter component 120 and exposes the ground doped region 130 for subsequent electrical connec-tion. Herein, the patterned photoresist 105 may be referred to as a second patterned photoresist.

In this embodiment, the annular groove C1 may penetrate through the dielectric layer 103 and the dielectric layer 104 in a depth direction D1 and has a gradually changing size (e.g., wide at the top and narrow at the bottom) in a width direction D2 to expose part of the light-shielding material 160a, so that a share contact structure may be formed subsequently. On the other hand, by treating the patterned photoresist 105 as a mask, part of the dielectric layer 103 and part of the dielectric layer 104 on the gates 122, 124, 126, and 142 and the doped regions 127 and 141 may also be removed together (for example, through an etching process) to form a plurality of contact vias V21 exposing the gates 122, 124, 126, and 142 and the doped regions 127 and 141. In other words, the annular groove C1 and the contact vias V21 may be formed by the same patterned photoresist 105 in the same process. In this way, the number of photoresists used may be saved, and the manufacturing costs may be effectively lowered, but the disclosure is not limited thereto. Herein, the contact vias V21 on the pixel array region RA may be referred to as second contact vias.

With reference to FIG. 3E, after the patterned photoresist 105 is removed through, for example, an ashing process, a light-shielding material 160b is deposited to fill the annular groove C1 and the contact vias V21 to form contacts 170 and another part of the light-shielding layer 160. The light-shielding material 160a and the light-shielding material 160b may together form the light-shielding layer 160. The light-shielding layer 160 on the pixel array region RA covers the storage node 123, and the light-shielding layer 160 on the border region RB surrounds the global shutter compo-nent 120. Herein, the light-shielding material 160b may be referred to as a second light-shielding material, the contacts 170 may be referred to as second contacts, the light-shielding layer 160 on the pixel array region RA may be referred to a first light-shielding layer, and the light-shield-ing layer 160 on the border region RB may be referred to as a second light-shielding layer. On the other hand, the light-shielding layer 160 may be electrically connected to the ground doped region 130 to be grounded, so that the light-shielding layer 160 is not in a floating state, and electrical problems are thus prevented from occurring.

Accordingly, in the image sensor 100 provide by this embodiment, the light-shielding layer 160 on the pixel array region RA blocks the light from the above, and the light-shielding layer 160 on the border region RB blocks the stray light from the side. In this way, the light incident on the region of the storage node 123 may be significantly reduced, so that the parasitic light sensitivity caused by the storage node 123 is effectively lowered.

Further, the specific form of a dotted line frame 20 in FIG. 2 may correspond to the dotted line frame 20 in FIG. 3E, and a light-shielding layer LS in FIG. 2 may correspond to the light-shielding layer 160 in FIG. 3E. Therefore, the light-shielding layer LS (light-shielding layer 160) may surround multiple surfaces (e.g., the top surface and the side surface) of the pixel array region RA to form a continuous wall structure, for example, so that the adverse effect generated by stray light SL on the storage node 123 may be greatly reduced. The adverse effect is, for example, that the stray light SL interferes with a signal stored in the storage node 123, causing the electrons generated in the substrate 110 to diffuse into the storage node 123 and become a source of signal pollution, but the disclosure is not limited thereto.

In some embodiments, as shown in FIG. 2, the light-shielding layer LS (light-shielding layer 160) only exposes the light incident/electrical connection portion L/E of the pixel array region RA, where the light incident portion corresponds to the photoelectric element 121, and the electrical connection portion corresponds to the gate electrodes 122, 124, 126, and 142, but the disclosure is not limited thereto.

In this embodiment, since the light-shielding material 160b fills the annular groove C1 and the contact vias V21 together, the contacts 170 in the contact vias V21 may be formed together with the light-shielding layer 160 on the border region RB, and part of the light-shielding material 160b may be deposited on the light-shielding material 160a. In addition, after the light-shielding material 160b is deposited, depending on actual design needs, a planarization process, such as a CMP process, may be further performed on the surfaces of the dielectric layer 104 and the light-shielding material 160b. In this way, a top surface 104t of the dielectric layer 104, a top surface 160t1 of the light-shielding layer 160 on the border region RB, and top surfaces 1700t of the contacts 170 may be coplanar. Further, the top surface 160t1 of the light-shielding layer 160 on the border region RB is higher than a top surface 160t2 of the light-shielding layer 160 on the pixel array region RA, but the disclosure is not limited thereto. Herein, the contacts 170 are electrically connected to the gates 122, 124, 126, and 142.

In some embodiment, the contacts 150 are physically connected to the light-shielding layer 160 on the pixel array region RA, and a width of the contacts 150 may be less than a width of the light-shielding layer 160 thereon, but the disclosure is not limited thereto.

In this embodiment, since the light-shielding layer 160 is a share contact formed by the light-shielding material 160a and the light-shielding material 160b, it may have a stepped profile as shown in FIG. 3E, but the disclosure is not limited thereto.

In some embodiments, the light-shielding layer 160 on the border region RB blocks the global shutter component 120 on the pixel array region RA from the peripheral circuit element 140 on the peripheral region RP, but the disclosure is not limited thereto.

Figure 3F:
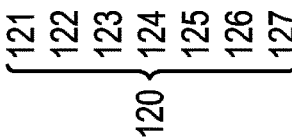

With reference to FIG. 3F, a circuit layer M1 is formed on the light-shielding layer 160. The circuit layer M1 may be formed by forming a conductive material (e.g., aluminum or copper) entirely on the substrate 110 through a suitable deposition process first, and the required circuit portion is then formed through a lithographic patterning process, but the disclosure is not limited thereto.

Figure 3G:
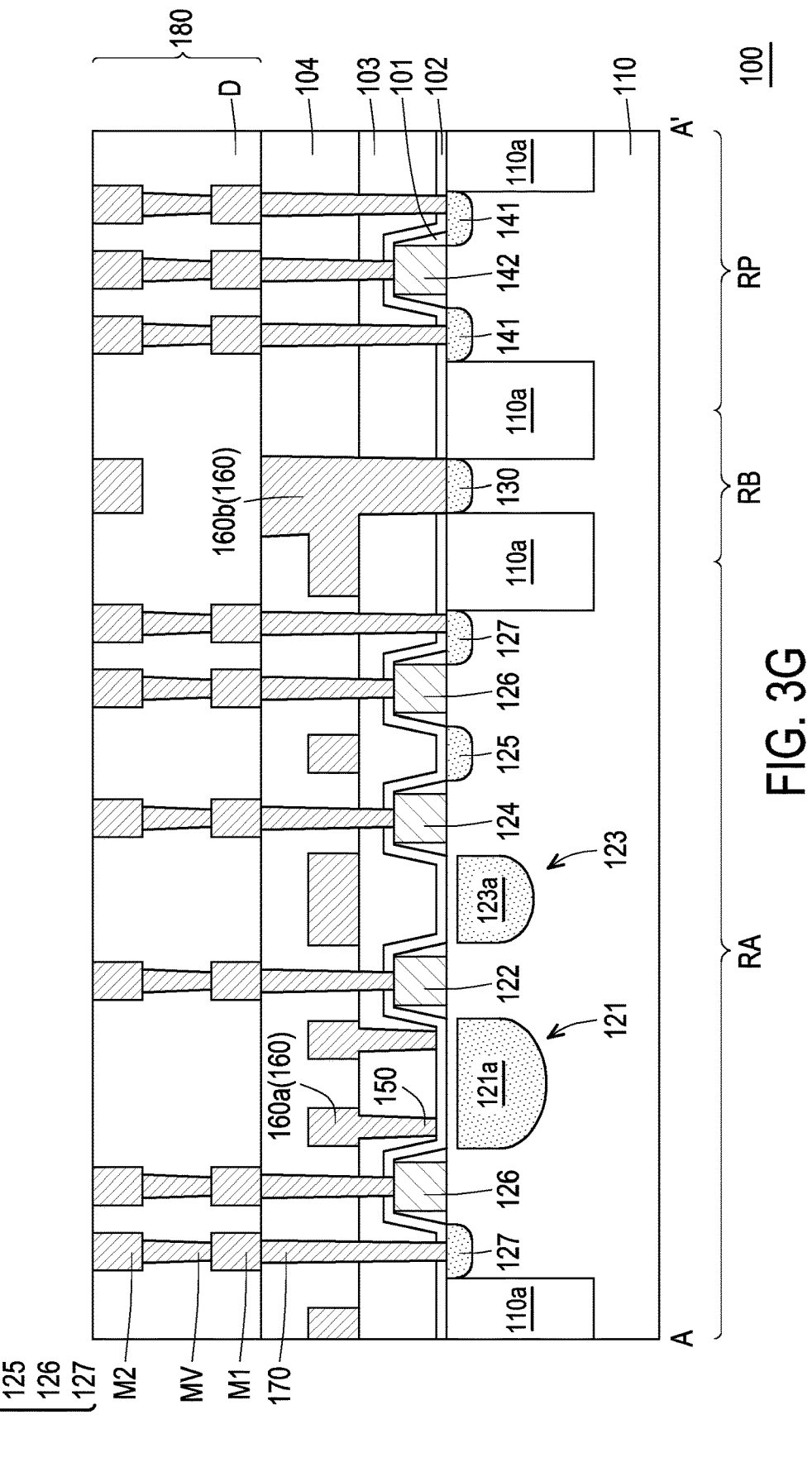

With reference to FIG. 3G, an interconnection layer MV, a circuit layer M2, and a dielectric layer D are formed on the circuit layer M1. The circuit layer M1 is electrically connected to the circuit layer M2 through the interconnection layer MV, the circuit layer M2 is similar to the circuit layer M1, and the interconnection layer MV is formed by a suitable via process. The circuit layer M1, the circuit layer M2, and the interconnection layer MV are all embedded in the dielectric layer D to form an interconnection structure 180. The fabrication of the image sensor 100 provided by this embodiment may be substantially completed through the above fabrication. Herein, the quantity, material, and manufacturing process of the circuit layers and dielectric layers in the interconnection structure are not limited in the disclosure, and may be determined according to actual design needs.

In this embodiment, the border region RB may not have the circuit layer M1 and the interconnection layer MV, but the disclosure is not limited thereto. In an embodiment that is not shown, the circuit layer M1 and the interconnection layer MV may also be formed between the circuit layer M2 and the light-shielding layer 160.

It should be noted that in the following embodiments, the reference numerals and parts of the abovementioned embodiments are used, where the same or similar reference numerals are used to denote the same or similar elements, and the description of the same technical content is omitted. For the description of the omitted part, reference may be made to the foregoing embodiments, and details are not to be repeated in the following embodiments.

With reference to FIG. 4A, similar to FIG. 3A, the difference is that after the dielectric layer 103 is formed, the patterned photoresist 106 is treated as a mask, so that part of the dielectric layer 103 on the ground doped region 130 is removed (for example, through an etching process) to form an annular groove C2 on the border region RB. The annular groove C2 surrounds the global shutter component 120 and exposes the ground doped region 130. Herein, the patterned photoresist 106 may be referred to as a third patterned photoresist.

With reference to FIG. 4A to FIG. 4B, after the patterned photoresist 106 is removed through an ashing process, for example, the patterned photoresist 107 is treated as a mask, so that part of the dielectric layer 103 on the photoelectric element 121 is removed (for example, through an etching process) to form the plurality of contact vias V11. That is, the annular groove C2 is formed before the contact vias V11 are formed and is formed by using a different patterned photoresist. Herein, the patterned photoresist 107 may also be referred to as the first patterned photoresist.

With reference to FIG. 4B to FIG. 4C and FIG. 2, after the patterned photoresist 107 is removed through an ashing process, for example, a light-shielding material 260 is deposited in the contact vias V11 and the annular groove C2 and extends onto the top surface 103t of the dielectric layer 103 to form the plurality of contacts 150 in the contact vias V11, and a light-shielding layer 260 is formed on the top surface 103*t* of the dielectric layer 103 and in the annular groove C2. The light-shielding layer 260 on the pixel array region RA covers the storage node 123, and the light-shielding layer 260 on the border region RB surrounds the global shutter component 120. Herein, the light-shielding layer 260 on the pixel array region RA may be referred to as the first light-shielding layer, and the light-shielding layer 260 on the border region RB may be referred to as the second light-shielding layer. On the other hand, the light-shielding layer 260 may be electrically connected to the ground doped region 130 to be grounded, so that the light-shielding layer 260 is not in a floating state. Herein, details of depositing the light-shielding material 260 may be similar to depositing the light-shielding material 160*a* to form a plurality of openings, corresponding to the light incident/electrical connection portion L/E on the pixel array region RA in FIG. 2, and description thereof is not to be repeated herein.

Accordingly, in the image sensor 200 provide by this embodiment, the light-shielding layer 260 on the pixel array region RA blocks the light from the above, and the light-shielding layer 260 on the border region RB blocks the stray light from the side. In this way, the light incident on the region of the storage node 123 may be significantly reduced, so that the parasitic light sensitivity caused by the storage node 123 is effectively lowered.

Further, the specific form of the dotted line frame 20 in FIG. 2 may correspond to the dotted line frame 20 in FIG. 4C, and the light-shielding layer LS in FIG. 2 may correspond to the light-shielding layer 260 in FIG. 4C. Therefore, the light-shielding layer LS (light-shielding layer 260) may surround multiple surfaces (e.g., the top surface and the side surface) of the pixel array region RA to form a continuous wall structure, for example, so that the adverse effect generated by stray light SL on the storage node 123 is greatly reduced, but the disclosure is not limited thereto. Herein, the light-shielding layer 260 may be made of tungsten (W) or other suitable light-shielding materials through a deposition process or other suitable processes.

In this embodiment, since the light-shielding layer 260 is completed by using only one process, it does not have a stepped profile, but the disclosure is not limited thereto.

Figure 4D:
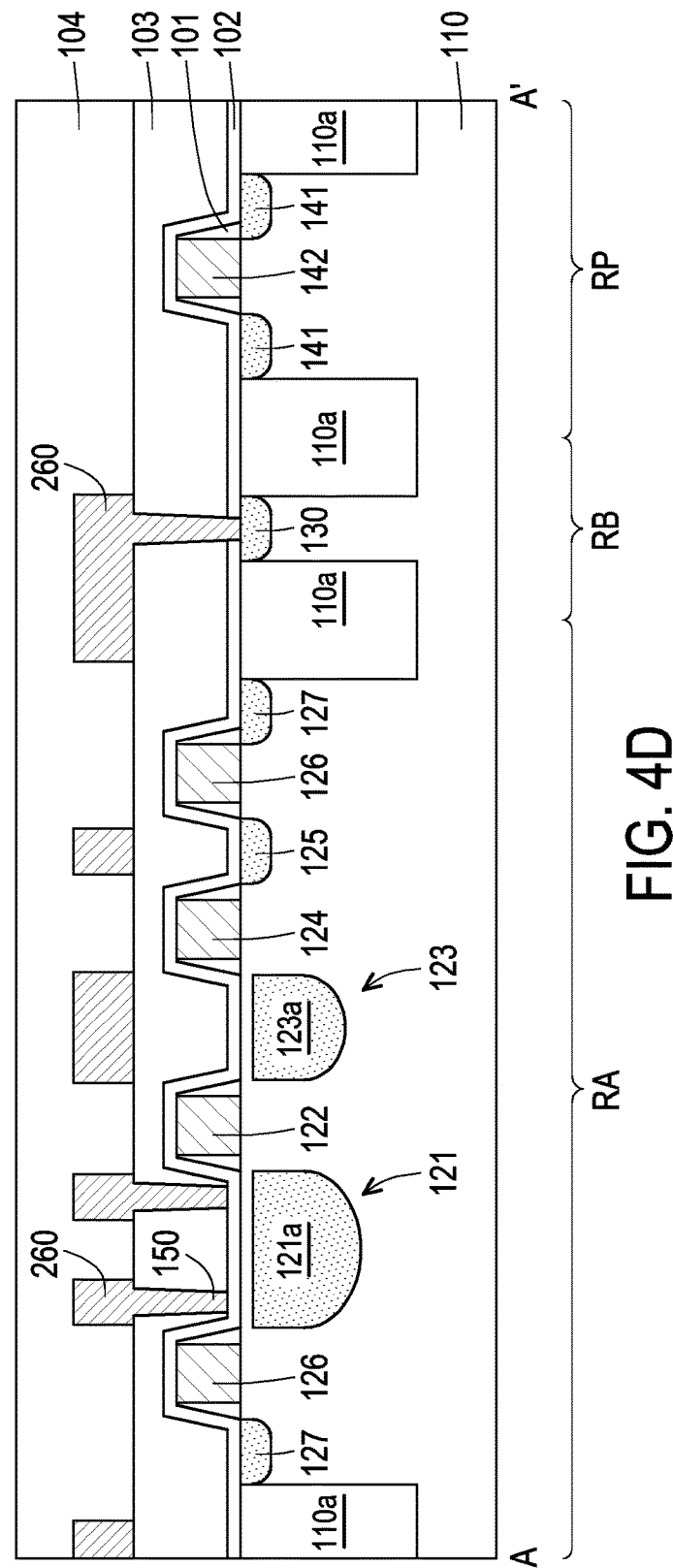
Figure 4D:
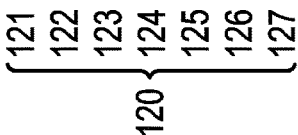

With reference to FIG. 4D, the dielectric layer 104 is formed on the substrate 110 entirely. For instance, the dielectric layer 104 may be formed on the pixel array region RA, the border region RB, and the peripheral region RP of the substrate 100 and cover the light-shielding layer 260, but the disclosure is not limited thereto.

In some embodiments, after the dielectric layer 104 is formed, a planarization process, such as a CMP process, may be further performed to improve the surface flatness of the dielectric layer 104, but the disclosure is not limited thereto.

Figure 4E:
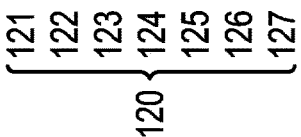
Figure 4F:
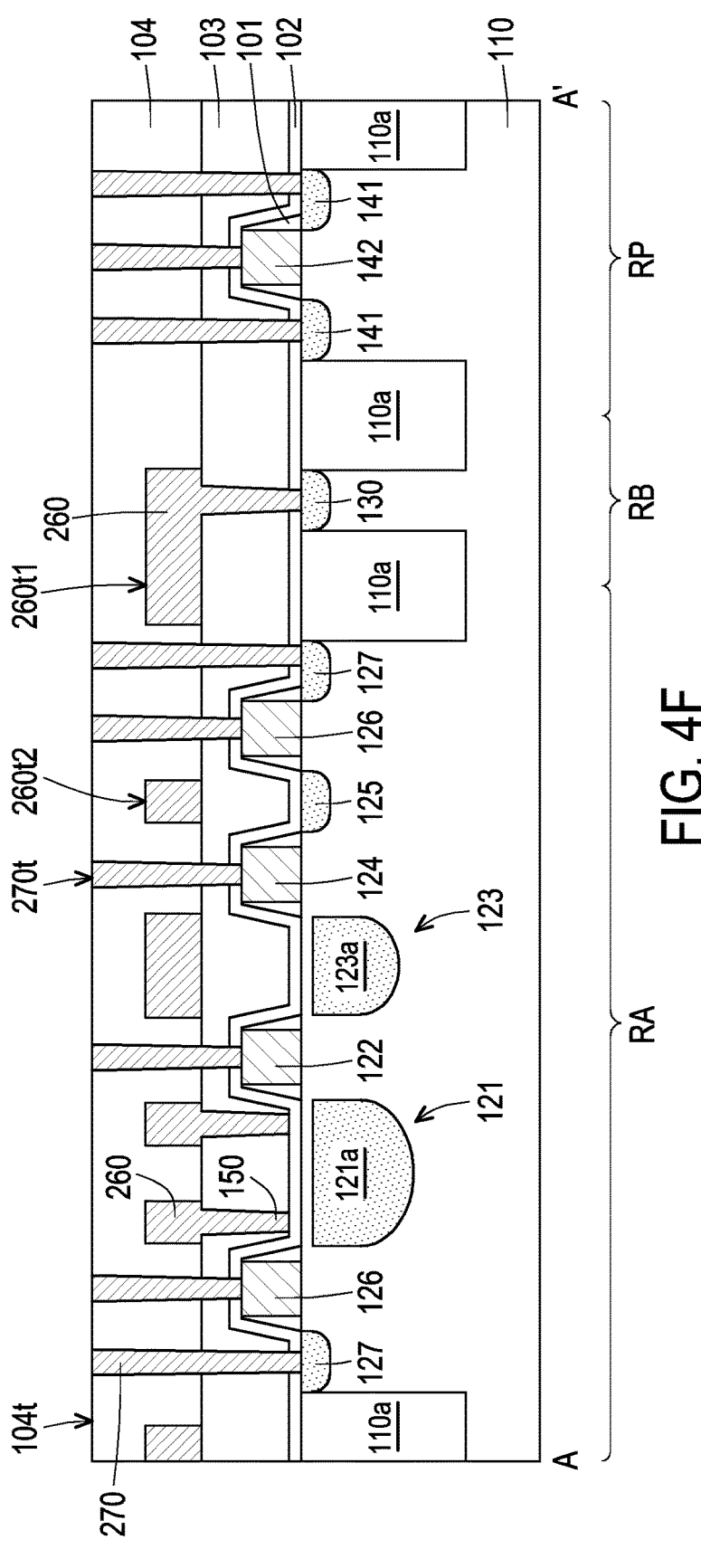

With reference to FIG. 4E to FIG. 4F, by treating the patterned photoresist 108 as a mask, part of the dielectric layer 103 and part of the dielectric layer 104 on the gates 122, 124, 126, and 142 and the doped regions 127 and 141 may be removed (for example, through an etching process) to form a plurality of contact vias V22 exposing the gates 122, 124, 126, and 142 and the doped regions 127 and 141. Next, after the patterned photoresist 108 is removed through an ashing process, for example, a plurality of contacts 270 are formed in the contact vias V22. Since the patterned photoresist 108 does not expose the light-shielding layer 260 on the border region RB, the conductive material forming the contacts 270 does not directly contact the light-shielding layer 260. Further, the material of the contacts 270 may be the same as or different from that of the light-shielding layer 260, for example, both may be tungsten (W). Herein, the patterned photoresist 108 may be referred to as a fourth patterned photoresist.

In this embodiment, the top surface 104*t* of the dielectric layer 104 and top surfaces 270*t* of the contacts 270 may be higher than a top surface 260*t*1 of the light-shielding layer 260 on the border region RB and a top surface 260*t*2 of the light-shielding layer 260 on the pixel array region RA. Further, the top surface 260*t*1 of the light-shielding layer 260 on the border region RB is coplanar with the top surface 260*t*2 of the light-shielding layer 260 on the pixel array region RA, but the disclosure is not limited thereto.

In some embodiments, after the contacts 270 are formed, a planarization process, such as a CMP process, may be further performed to improve the surface flatness of the contacts 270, but the disclosure is not limited thereto.

Figure 4G:
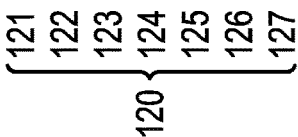
Figure 4H:
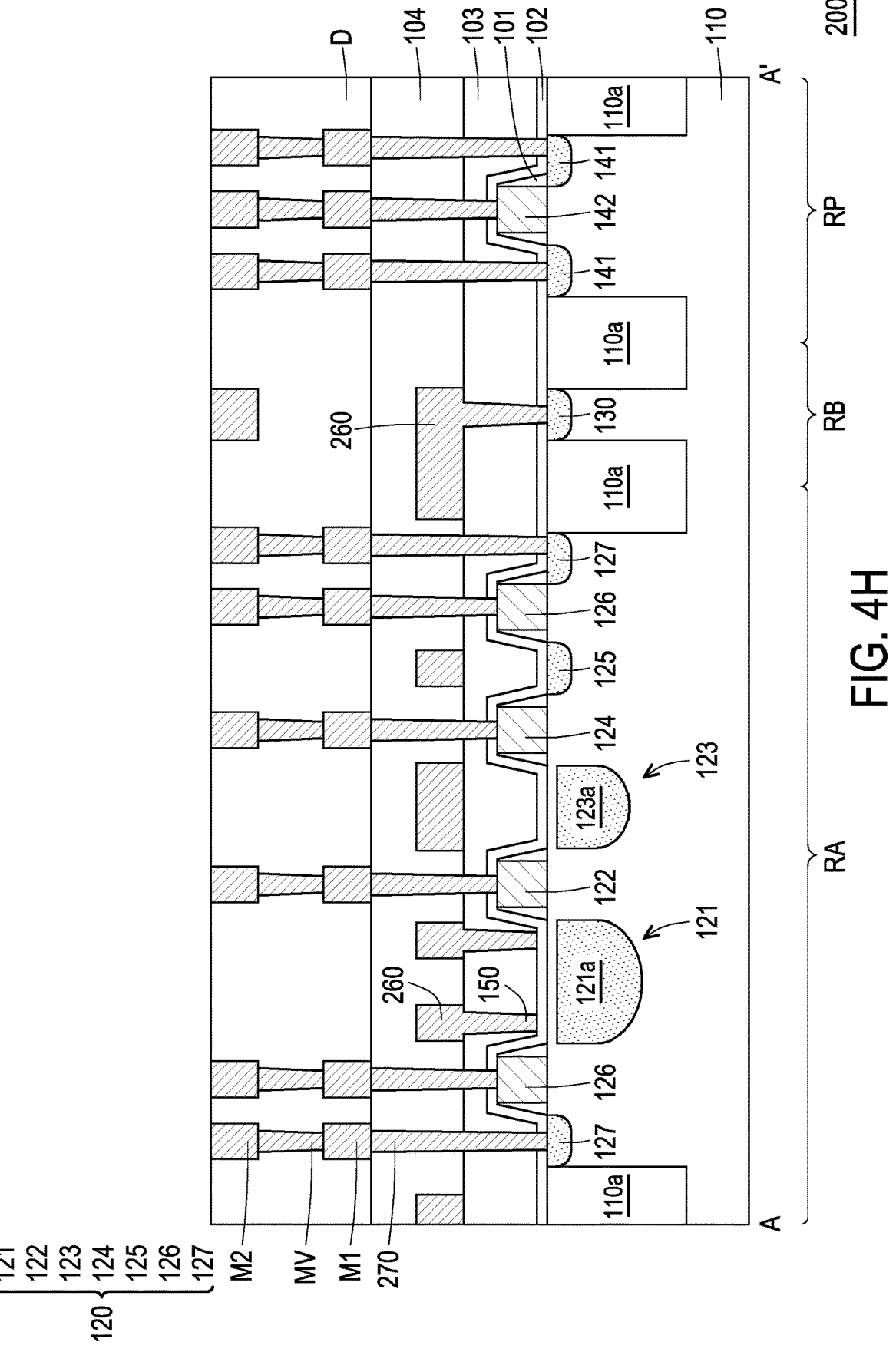

With reference to FIG. 4G and FIG. 4H, the circuit layer M1, the interconnection layer MV, the circuit layer M2, and the dielectric layer D are formed on the contacts 270. The circuit layer M1 is electrically connected to the circuit layer M2 through the interconnection layer MV. The circuit layer M1, the circuit layer M2, and the interconnection layer MV are embedded in the dielectric layer D to form the interconnection structure 180. The fabrication of the image sensor 200 provided by this embodiment may be substantially completed through the above fabrication.

FIG. 5 is a schematic flow chart of part of a manufacturing process of an image sensor according to an embodiment of the disclosure. The main manufacturing steps of the image sensor provided by the disclosure are described below with a flow chart.

First, a substrate is provided, where the substrate at least has a pixel array region and a border region adjacent to each other (step S100). Next, a global shutter component is formed on the pixel array region, where the global shutter component includes a storage node (step S200). A ground doped region is formed as well on the border region (step S300). Next, an annular groove is formed on the border region to surround the global shutter component, where the annular groove exposes the ground doped region (step S400). A light-shielding layer is formed on the pixel array region and the border region and is electrically connected to the ground doped region, where a first light-shielding layer of the light-shielding layer covers the storage node, and at least a portion of a second light-shielding layer of the light-shielding layer fills the annular groove (step S500).

In view of the foregoing, in the image sensor provide by the disclosure, the light-shielding layer on the pixel array region blocks the light from the above, and the light-shielding layer on the border region blocks the stray light from the side. In this way, the light incident on the region of the storage node may be significantly reduced, so that the parasitic light sensitivity caused by the storage node is effectively lowered.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An image sensor, comprising:
a substrate at least having a pixel array region and a border region adjacent to each other;

a global shutter component located on the pixel array region, wherein the global shutter component comprises a storage node;

a ground doped region located on the border region; and a light-shielding layer located on the pixel array region and the border region and electrically connected to the ground doped region, wherein the light-shielding layer comprises a first light-shielding layer and a second light-shielding layer, the first light-shielding layer is located on the pixel array region and covers the storage node, and the second light-shielding layer is located on the border region and surrounds the global shutter component.

2. The image sensor according to claim 1, further comprising a plurality of first contacts located on the pixel array region, wherein the first contacts are physically connected to the light-shielding layer.

3. The image sensor according to claim 1, wherein the light-shielding layer only exposes a light incident/electrical connection portion of the pixel array region, a light incident portion in the light incident/electrical connection portion corresponds to a photodiode in the global shutter component, and an electrical connection portion in the light incident/electrical connection portion corresponds to a plurality of gates in the global shutter component.

4. The image sensor according to claim 1, wherein the substrate further comprises a peripheral region, the border region is located between the pixel array region and the peripheral region, and the second light-shielding layer isolates the global shutter component on the pixel array region from a peripheral circuit element on the peripheral region.

5. The image sensor according to claim 1, wherein a top surface of the second light-shielding layer is higher than a top surface of the first light-shielding layer.

6. The image sensor according to claim 5, further comprising a plurality of second contacts located on the pixel array region, wherein the second contacts are electrically connected to the global shutter component, and top surfaces of the second contacts are coplanar with the top surface of the second light-shielding layer.

7. The image sensor according to claim 5, wherein the second light-shielding layer has a stepped profile.

8. The image sensor according to claim 1, wherein a top surface of the first light-shielding layer is coplanar with a top surface of the second light-shielding layer.

9. The image sensor according to claim 8, further comprising a plurality of second contacts located on the pixel array region, wherein the second contacts are electrically connected to the global shutter component, and top surfaces of the second contacts are higher than the top surface of the first light-shielding layer and the top surface of the second light-shielding layer.

10. The image sensor according to claim 8, wherein the second light-shielding layer does not have a stepped profile.

* * * * *